United States Patent [19]

Razeghi

[11] Patent Number: 5,389,396
[45] Date of Patent: *Feb. 14, 1995

[54] INGAASP/GAAS DIODE LASER

[75] Inventor: Manijeh Razeghi, Evanston, Ill.

[73] Assignee: Northwestern University, Evanston, Ill.

[*] Notice: The portion of the term of this patent subsequent to Jan. 24, 2012 has been disclaimed.

[21] Appl. No.: 105,379

[22] Filed: Aug. 11, 1993

[51] Int. Cl.$^6$ .............................................. C23C 16/00
[52] U.S. Cl. .................................... 427/58; 427/124; 427/255.2; 427/255.7
[58] Field of Search ...................... 427/58, 124, 255.2, 427/255.7

[56] References Cited

U.S. PATENT DOCUMENTS

| | | | |
|---|---|---|---|
| 3,364,084 | 1/1968 | Ruehrwein | 437/126 |
| 3,663,320 | 5/1972 | Maruyama | 427/255.2 |
| 4,368,098 | 1/1983 | Manasevit | 156/606 |
| 4,404,265 | 9/1983 | Manasevit | 428/689 |
| 4,902,356 | 2/1990 | Noguchi | 437/127 |
| 5,232,869 | 8/1993 | Frigo | 427/124 |

OTHER PUBLICATIONS

K. Sugiyama et al "Vapor Phase Epitaxial Growth and Characterization of $Ga_{1-y}$ $In_y$ $As_{1-x}$ $P_x$ Quaternary Alloys" Japanese Journal of Applied Physics vol. 16, No. 12, Dec. 1977, pp. 2197-2203.

"Accurate Determination of Misfit Strain, Layer Thickness, and Critical Layer Thickness in Ultrathin Buried Strained InGaAs/GaAs Layer by X-Ray Diffraction," Chen, Y. C. et al., Mar/Apr 1992, J. Vac. Sci. Technol. B 10 (2), (American Vacuum Society), pp. 769-771.

"$Ga_{0.51}In_{0.49}P/Ga_xIn_{1-x}As$ Lattice-Matched (x=1) and Strained (x=0.85) Two Dimensional Electron Gas Field-Effect Transistors," Razeghi, M., et al., Semicond. Sci. Technol. 6, 1991, (IOP Publishing Ltd.), pp. 103-7.

"High-Power 0.8μm InGaAsP-GaAs SCHSQW Lasers," Garbuzov, D. Z., et al., IEEE Journal of Quantum Electronics, vol. 27, No. 6, Jun. 1991, pp. 1531-1535.

"Recent Advances on GaAs-GAInP Multiquantum Wells Grown in MOCVD on GaAs, InP and Silicon Substrates," Omnes, F. et al., Thomson CSF LCR, (91404 Orsal Cedex, France), pp. 15-36 No month, year.

"Low-Pressure Metallo-Organic Chemnical Vapor Deposition of $Ga_xIn_{1-x}As_yP_{1-y}$Alloys," Razeghi, M., Semiconductors and Semimetals, vol. 22, Part A, pp. 299-378 No month, year.

"Growth Technology," Razeghi, M., The MOCVD Challenges, vol. 1, A Survey of GaInAsP-InP for Photonic and Electronic Applications, (Bristol: Adam Hilger), pp. 3-17 No month, year.

"GaInAsP-InP Sysatem: MOCVD Growth, Characterization and Application," Razeghi, M., The MOCVD Challenges, vol. 1, A Survey of GaInAsP-InP for Photonic and Electronic Applications, (Bristol: Adam Hilger), pp. 165-215 no month, year.

Primary Examiner—Shrive Beck
Assistant Examiner—Vi Duong Dang
Attorney, Agent, or Firm—Welsh & Katz

[57] ABSTRACT

Diode lasers of the formula GaInP/InGaAsP on GaAs substrates which operate at powers up to 5.3 W with emitting apertures of 100 microns are disclosed. By varying compositions of the active layer and by employing strained layer quantum wells, InGaAsP diode lasers are fabricated over the wavelength range of 700 to 1100 nm.

4 Claims, 2 Drawing Sheets (a)

INGAASP/GAAS DIODE LASER

This application relates to semiconductor III–V alloy compounds, and more particularly to a method of making III–V alloy compounds for use in diode lasers.

BACKGROUND OF THE INVENTION

The growth of semiconductor III–V compounds by chemical vapor deposition (CVD) using organometallics and hydrides as elemental sources has recently developed into a viable process with many potential commercial applications. The metallo-organic chemical vapor deposition (MOCVD) process, based on the pyrolysis of alkyls of group-III elements in an atmosphere of the hydrides of group-V elements, is a common growth technique because it is well adapted to the growth of submicron layers and heterostructures.

Open-tube flow systems are used at atmospheric or reduced pressures in producing the III–V alloys. The process requires only one high-temperature zone for the in situ formation and growth of the semiconductor compound directly on a heated substrate.

FIG. 1 shows the x-y compositional plane for quaternary III–V alloys matched to an InP substrate at 300K. The x-y coordinate of any point in the plane gives the compositions of the alloys. The curved contour lines correspond to curves of constant energy gap ($E_g$). The straight black contour lines correspond to curves of constant lattice parameters. The black line labeled GaInP corresponds to alloys having a lattice constant matching that of GaAs 5.653 Å. The cross-hatched region corresponds to alloys having indirect band gaps.

Low pressure (LP−) MOCVD growth method offers an improved thickness uniformity and compositional homogeneity, reduction of autodoping, reduction of parasitic decomposition in the gas phase, and allows the growth of high-quality material over a large surface area. The LP-MOCVD technique has been successfully used to grown $Ga_xIn_{1-x}As_yP_{1-y}$ ($0 \leq x \leq 0.47$ and $0 \leq y \leq 1$) lattice matched to InP for the complete compositional range between InP ($\lambda = 0.91$ μm, $E_g = 1.35$ eV) and the ternary compound $Ga_{0.47}In_{0.53}As$ ($\lambda = 1.67$ μm, $E_g = 0.75$ eV). GaInAsP alloys, which are potentially useful materials both for heterojunction microwave and optoelectronic device applications can be grown by liquid-phase epitaxy (LPE), molecular-beam epitaxy (MBE), conventional vapor-phase epitaxy (VPE), as well as MOCVD.

The disadvantages of LPE include growth problems with GaInAsP alloys for $\lambda > 1.4$ μm and potential nonuniform growth as well as melt-back effect. Molecular-beam epitaxy is a very expensive and complex process, and difficulties have been reported with p-type doping and with the growth of phosphorus-bearing alloys. Vapor-phase epitaxy disadvantages include potential for hillock and haze formation and interfacial decomposition during the preheat stage.

The technique of LP-MOCVD is well adapted to the growth of the entire composition range of GaInAsP layers of uniform thickness and composition that is lattice matched to GaAs over areas of more than 10 $cm^2$. This results first from the ability of the process to produce abrupt composition changes and second from the result that the composition and growth rate are generally temperature independent. It is a versatile technique, numerous starting compounds can be used, and growth is controlled by fully independent parameters.

Growth by MOCVD takes place far from a thermodynamic equilibrium, and growth rates are determined generally by the arrival rate of material at the growing surface rather than by temperature-dependent reactions between the gas and solid phases. In contrast to LPE growth, it has been found that during MOCVD growth of a double heterostructure, GaAs can be grown directly on GaInAsP with no disturbance of the active layer, i.e., there is no effect equivalent to melt-back.

One of the key reasons for the usefulness of this method is the possibility of obtaining high-purity and therefore high-mobility $Ga_xIn_{1-x}As_yP_{1-y}$. As long-wavelength 1.0–1.65 μm GaInAsP electro-optical devices become more widely used, motivated by low fiber absorption and dispersion, high transmission through water and smoke, and greatly enhanced eye safety at wavelengths greater than 1.4 μm, LP-MOCVD offers the advantages of smooth uniform surfaces, sharp interfaces (lower than 5 Å for GaInAsP/GaAs), uniformly lower background doping density, and economy of scale for large-area devices.

Recent studies have shown the feasibility of using InGaAsP/GaAs heterostructures as diode lasers. The diodes can be used successfully for solid state laser pumping and can be interchanged with lasers based on AlGaAs/GaAs heterostructures.

Laser diodes emitting at 808 nm wavelength are important sources for the pumping of YAG:Nd lasers. AlGaAs/GaAs lasers are commonly used for this purpose, but there are several problems with these structures: Oxidation of AlGaAs layers which makes further regrowth and device fabrication difficult; higher growth temperature which may not be compatible with monolithic integration; and the presence of dark line defects and dislocation migration which can cause degradation in performance. Most of these problems can be attributed to the presence of Aluminum. High-power quantum well lasers-based on liquid phase epitaxy (LPE) grown GaInAsP/GaAs structures do demonstrate characteristics competitive to the best existing AlGaAs/GaAs separate confinement heterostructure-single quantum well (SCH-SQW) lasers but, as stated above, growth by LPE present several major disadvantages.

SUMMARY OF THE INVENTION

An object, therefore, of the invention is the growth of high quality $Ga_xIn_{1-x}As_yP_{1-y}$ ($\lambda$ between 700 up to 840 nm)=808 nm)/GaAs double heterostructures by low pressure metallorganic chemical vapor deposition (LP-MOCVD).

A further object of the subject invention is a double heterojunction laser structure grown with strained layer quantum wells.

A still further object of the subject invention is a method of controlling the wavelength range and energy gap of the diode laser by varying both the composition of the strained layer quantum wells.

Another object of the subject invention is a method of changing the wavelength by changing the Ga sources and As sources to vary the composition of the resulting heterojunction composition.

A still further object of the subject invention is a method of doping a contact layer of a heterostructure for use in a diode laser so as to include a high volume percentage of dopant atoms in the surface.

These and other objects are attained by the subject invention wherein SCH-SQW (separate confinement heterostructure, single quantum well) diode lasers of the formula GaInP/InGaAsP on GaAs substrates which operate at powers up to 5.3 W with emitting apertures of 100 microns are found to be superior to AlGaAs lasers in terms of quantum efficiency and temperature rise at the mirror facets. By varying compositions and by employing strained layer quantum wells, InGaAsP diode lasers can be fabricated over the wavelength range of 700 to 1100 nm.

DETAILED DESCRIPTION OF THE INVENTION

Figure 1:
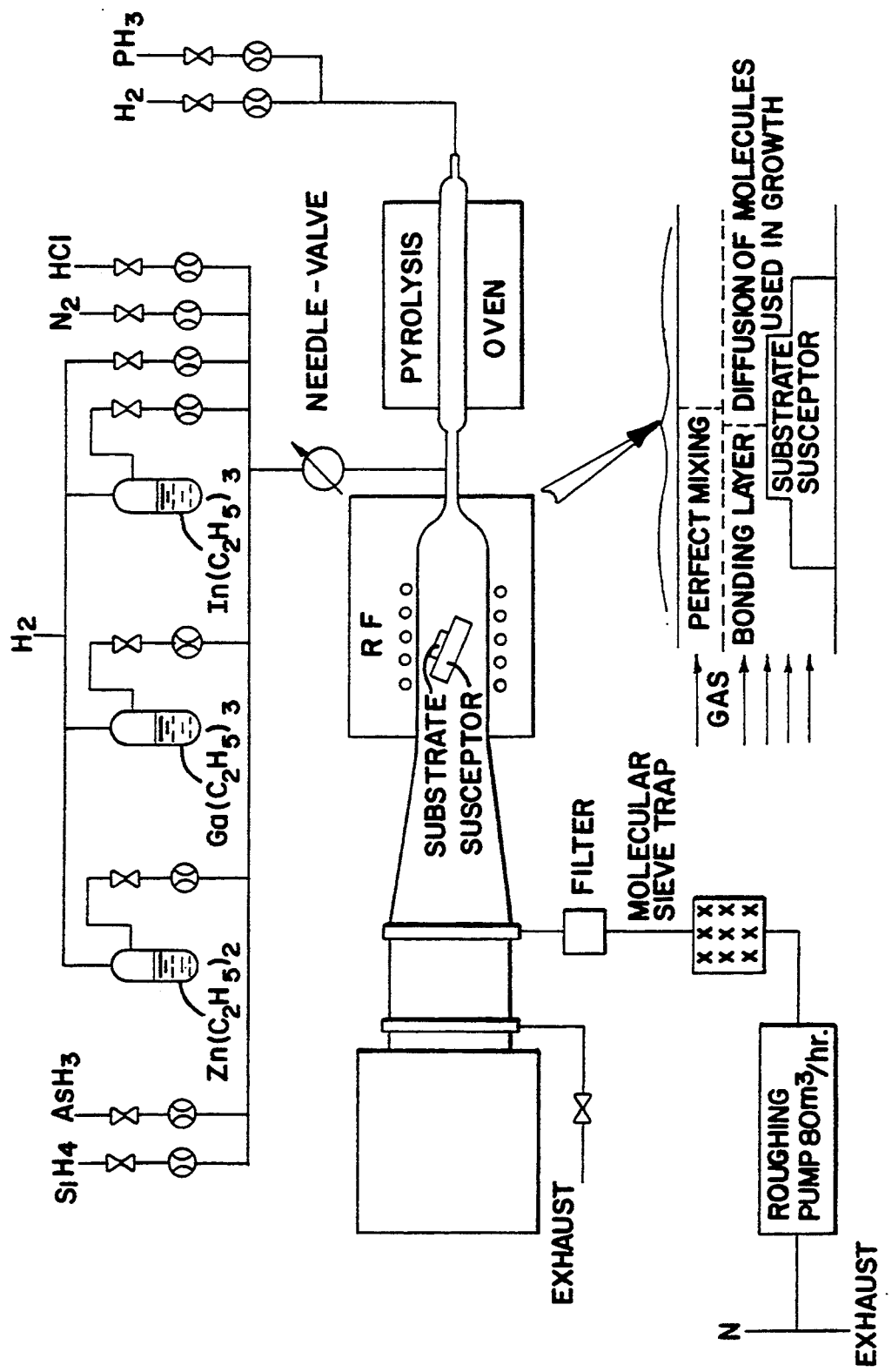
FIG. 1 is a schematic diagram of the LP-MOCVD reactor for use in the method of the subject invention.
Figure 2:
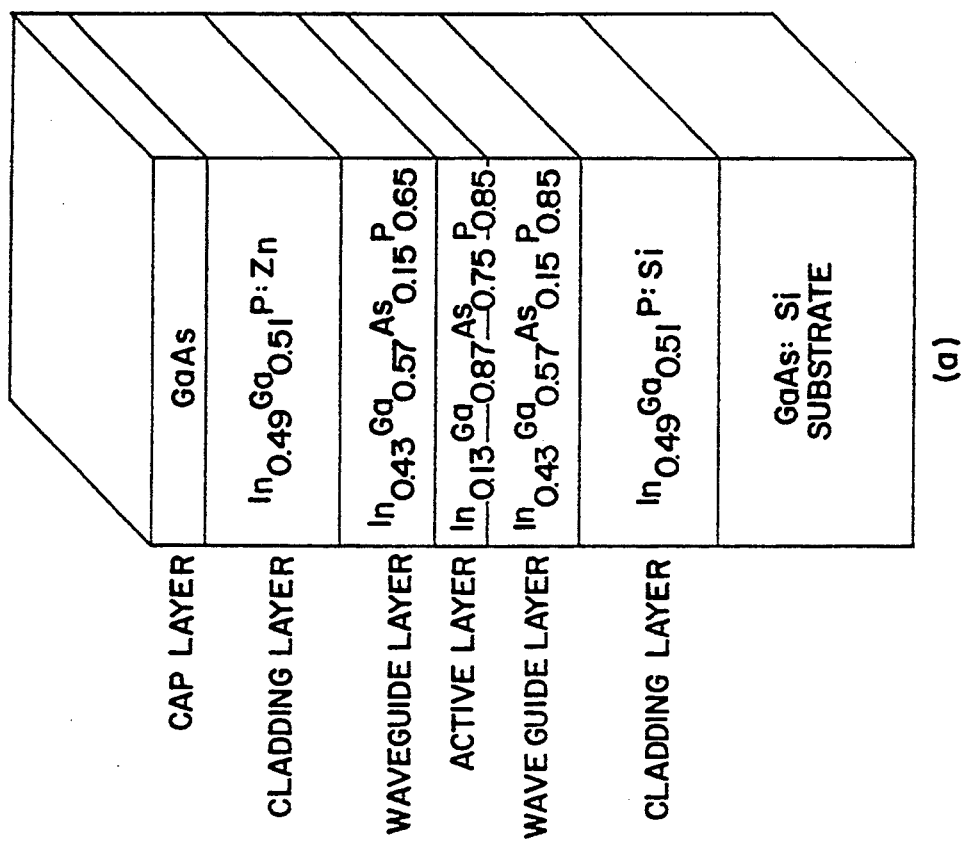
FIG. 2 is a plot of the compositional plane for quaternary III–V alloys matched to an InP substrate.

The reactor and associated gas-distribution scheme used herein are shown in FIG. 1. The system consists of a cooled quartz reaction tube (diameter 5 cm in the substrate area) pumped by a high-capacity roughing pump to a vacuum between 10 and 300 Torr. The substrate was mounted on a pyrolytically coated graphite susceptor that was heated by rf induction at 1 MHz. The pressure inside the reactor was measured by a mechanical gauge and the temperature by an infrared pyrometer. A molecular sieve was used to impede oil back-diffusion at the input of the pump. The working pressure was adjusted by varying the flow rate of the pump by using a control gate valve. The gas panel was classical, using $\frac{1}{4}$-inch stainless steel tubes and Swagelock fittings. Flow rates were controlled by mass flowmeters.

The reactor was purged with a nitrogen flow of 4 liters min$^{-1}$, and the working pressure of 75 Torr was established by opening the gate valve that separated the pump and the reactor. The evacuation line that was used at atmospheric pressure was automatically closed by the opening of the gate valve. The gas flow rates were measured under standard conditions, i.e., 1 atm and 20° C., even when the reactor was at subatmospheric pressure. The pressure in the gas panel was regulated by the needle valve placed between the gas panel and the reactor. The needle valve was adjusted to maintain a constant pressure of 1 atm on the gas panel, thereby ensuring reproducibility of flow-rate measurements.

The gas source used in this study for the growth of GaInAsP by LP-MOCVD are listed in the accompanying tabulation. The organometallic

| Group-III Sources | Group-V Sources |
|---|---|
| Ga(C$_2$H$_5$)$_3$ | AsH$_3$ |
| In(CH$_3$)$_3$ | PH$_3$ | group-III species trimethyl indium (TMI) and triethyl gallium (TEG) are contained in stainless steel bubblers, which are held in controlled temperature baths at 31° and 0° C., respectively. An accurately metered flow of purified H$_2$ for TMI and TEG is passed through the appropriate bubbler. To ensure that the source material remains in vapor form, the saturated vapor that emerges from the bottle is immediately diluted by a flow of hydrogen. The mole fraction, and thus the partial pressure, of the source species is lower in the mixture and is prevented from condensing in the stainless steel pipe work.

Pure and diluted arsine (AsH$_3$) and pure phosphine (PH$_3$) are used as sources of As and P, respectively. The metal alkyl or hydride flow can be either injected into the reactor or into the waste line by using two-way valves. In each case, the source flow is first switched into the waste line to establish the flow rate and then switched into the reactor. The total gas flow rate is 8 liters min$^{-1}$. Stable flows are achieved by the use of mass flow controllers.

Semi-insulating or n$^+$ substrates are supplied by MCP, Crystacomm, Metals Research, or Sumitomo in the form of ingots or polished wafers. Wafers are sliced 2° off (100) toward (110) and chemically etched for 10 seconds at room temperature in a 15% bromine-methanol solution in order to remove 20 μm from each side. The wafers were then mechanochemically polished in a solution of 1.5% bromine in methanol, removing a further 80–100 μm. The substrates were finally cleaned in methanol and rinsed in isopropyl alcohol. The substrates were etched again, just before use, by dipping in 1% bromine in methanol at room temperature for one minute, rinsing in warm isopropyl alcohol, and drying. An n$^+$ tin-doped substrate and a semi-insulating iron-doped substrate were generally used for each experiment.

The epitaxial layer quality is sensitive to the pretreatment of the substrate and the alloy composition.

Pretreatment of the substrates prior to epitaxial growth was thus found to be beneficial. One such pretreatment procedure is as follows:

1. Dipping in H$_2$SO$_4$ for 3 minutes with ultrasonic agitation;
2. Rinsing in Deionized H$_2$O;
3. Rinsing in hot methanol;
4. Dipping in 3% Br in methanol at room temperature for 3 minutes (ultrasonic bath);
5. Rinsing in hot methanol;
6. Dipping in H$_2$SO$_4$ for 3 minutes;
7. Rinsing in deionized H$_2$O, and
8. Rinsing in hot methanol.

After this treatment, it is possible to preserve the substrate for one or two weeks without repeating this treatment prior to growth.

Growth takes place by introducing metered amounts of the group-III alkyls and the group-V hydrides into a quartz reaction tube containing a substrate placed on an rf-heated susceptor surface. The hot susceptor has a catalytic effect on the decomposition of the gaseous products; the growth rate is proportional to the flow rate of the group-III species but is independent of temperature between 500° and 600° C. and of the partial pressure of group-V species as well. The gas molecules diffuse across the boundary layer to the substrate surface, where the metal alkyls and hydrides decompose to produce the group-III and group-V elemental species. The elemental species move on the hot surface until they find an available lattice site, where growth then occurs.

High quality GaInAsP/GaAs may be grown in the method of the subject invention by low pressure metallorganic chemical vapor deposition (LP-MOCVD). The layers of the heterostructure are grown by the induction-heated horizontal cool wall reactor of FIG. 1, as described below in more detail. Trimethylindium (TMI) and triethylgallium (TEG) are used as the sources of Indium and Gallium. Pure and diluted arsine (AsH$_3$) and phosphine (PH$_3$) supplied by Matheson Inc. are used as As and P sources. Sample is grown on a (001) GaAs substrate with 2 degree misorientation toward <110>, thus giving rise to a strained layer quantum well. The optimum growth conditions are listed in Table 1. Doping is conducted with diethyl zinc (DEZ) for p-type doping and silane (SiH$_4$) for n-type doping. Doping is performed through the DEZ bubbler shown in FIG. 1 with H$_2$ as carrier gas and at temperatures from −15° C. to ambient temperatures at 20-90 cm$^3$ min.$^{-1}$ and onto either a hot or cooled substrate (535° C.). SiH$_4$ or H$_2$S may be simply directed at ambient temperatures onto the hot substrate at 20-90 cm$^3$ min.$^{-1}$.

In a preferred doping method for incorporating the maximum amount of dopant on the layer, once the layer to be doped is fully grown, the heat source is terminated and the substrate allowed to cool; the metal and hydride sources are terminated; the dopant flow, for instance DEZ, is initiated at the temperatures indicated for diffusion onto the cooled substrate/epilayer which has been previously grown. After about 2-3 minutes, the dopant flow is terminated and the next epilayer grown. By this method, it is found that $10^{20}$ atoms of Zn may be placed on the top surface of the epilayer.

TABLE 1

Optimum growth conditions of GaInP/GaInAsP/GaInP/GaAs structure.

|  | GaAs | GaInP | GaInAsP |
|---|---|---|---|
| Growth Pressure (Torr) | 76 | 76 | 76 |
| Growth Temperature (°C.) | 535 | 535 | 535 |
| Total H$_2$ Flow (liter/min) | 3 | 3 | 3 |
| AsH$_3$ (cc/min) | 30 | — | 20 |
| TMI (cc/min) | — | 200 | 150 |
| TEG (cc/min) | 120 | 120 | 120 |
| PH$_3$ (cc/min | — | 300 | 200 |
| Growth Rate (Å/min) | 150 | 300 | 250 |

The GaAs layers can be grown at 76 Torr and low temperature, between 500° and 600° C., by using TEG and arsine (AsH$_3$) in a H$_2$ or N$_2$ or H$_2$+N$_2$ carrier gas.

Layers of InGaP can be grown at 76 Torr and low temperature, between 500° and 600° C., using TEI or TMI, TEG, and ASH$_3$ in an H$_2$ or N$_2$ or H$_2$+N$_2$ carrier gas. Uniform composition In$_{0.49}$Ga$_{0.51}$P:Zn over an area of 10 cm$^2$ of GaAs substrate has been obtained. GaAs-InGaP interfaces can be obtained by turning off the arsine flow and turning on both the TMI and the PH$_3$. InGaP-GaAs interfaces can be obtained by turning off the PH$_3$ and TMI flow and turning on the AsH$_3$ flow. The growth rate is small (5 Å sec$^{-1}$), and it takes less than 1 second for a gas flow to reach its new steady state.

The thickness of an epilayer was measured by a bevel stain technique (solution) and the composition calculated either from the PL wavelength or from the value of the lattice parameter as measured by single-crystal x-ray diffraction. The waveguide layers and active layers of InGaAsP are grown as follows.

For GaInAsP ($\lambda = 1.3$ μm), one obtains the ratio of partial pressure of $P_p/P_{As}=(1-y)/y \approx 20$, $P_{In}/P_{Ga}=(1-x)/x \approx 3$, $P_{(As+P)}/P_{(In+Ga)} \approx 600$.

Thus, with a growth temperature of 650° C. and total flow rate of 7 liters min$^{-1}$, one can obtain Ga$_x$In$_{1-x}$As$_y$P$_{1-y}$ epitaxial layers with different compositions between GaAs (x=0, y=0) and GaInAs (X=0.47, y=1).

After optimization of growth conditions for GaAs and InGaAsP layers, LP-MOCVD has been successfully used for the growth of GaInAsP/GaAs double heterostructure layers, for laser application emitting at 1.3 and 1.5 μm. The various interfaces were produced by controlling the flow of the relevant component, as in the case of GaInAs mentioned previously.

The growth rate for these quaternary materials was small (as was the case for the ternary materials) (~3 Å sec$^{-1}$), and the gas flow stabilized to its new steady-stable value in less than 1 second after switching. The thickness of the quaternary layers varied from 300 Å-1.0 μm, as follows.

Wafers grown as set forth above were lapped to a thickness of 100 μm and Au—12% Ge and Au 8% Zn contact metallizations were deposited on the n and p sides, respectively. The contacts were then annealed at 400° C. for 5 minutes in an argon ambient. The devices were cleaved and sawn, producing chips of width 150 μm with cavity lengths in the range 300-1000 μm. The laser chips were tested, unmounted under pulsed conditions at a pulse repetition rate of $10^4$ Hz with a pulse length of 100 nsec. For chips cleaved from the same bar, the standard deviation in the lasing threshold current density was only ±5%. For a large slice area (10 cm$^2$), the standard deviation in lasing threshold was typically less than 20%.

EXAMPLE 1

A double heterostructure for a diode laser as set forth in FIG. 3 was prepared on a GaAs substrate according to the above methods and in the following manner. First, a 2-μm thick InGaP diode (n=1×10$^{18}$) confinement or cap layer doped with Si; a 0.5 μm waveguide layer of In$_{0.43}$Ga$_{0.57}$As$_{0.15}$P$_{0.85}$, and a 0.2-μm thick undoped In$_{0.13}$Ga$_{0.87}$As$_{0.75}$P$_{0.25}$ active layer (1.55 μm wavelength composition), over a 0.5-μm-thick In$_{0.43}$Ga$_{0.57}$As$_{0.15}$P$_{0.85}$ waveguide layer (1.3-μm wavelength composition) were successively grown by LP-MOCVD on a Si-doped (100) 2° off GaAs substrate. The growth temperature was 650° C. Next, corrugations with a period of Λ=4600 Å [Λ=(λL/2n$_e$), where λ is the lasing wavelength and n$_e$ the effective refractive index], (second-order grating) were formed in the top of the guiding (1.3 μm) layers by holographic photolithography and chemical etching, by orienting the gratings along the (011) direction. The gratings were then covered with 2 μm of Zn-doped In$_{0.49}$Ga$_{0.51}$P (the confinement layer) and 0.2-μm GaAs (1.3-μm wavelength composition) (the cap layer). The resulting laser diode exhibited a wavelength of λ=808 nm, and an energy gap of E$_g$=1.535.

Figure 3:
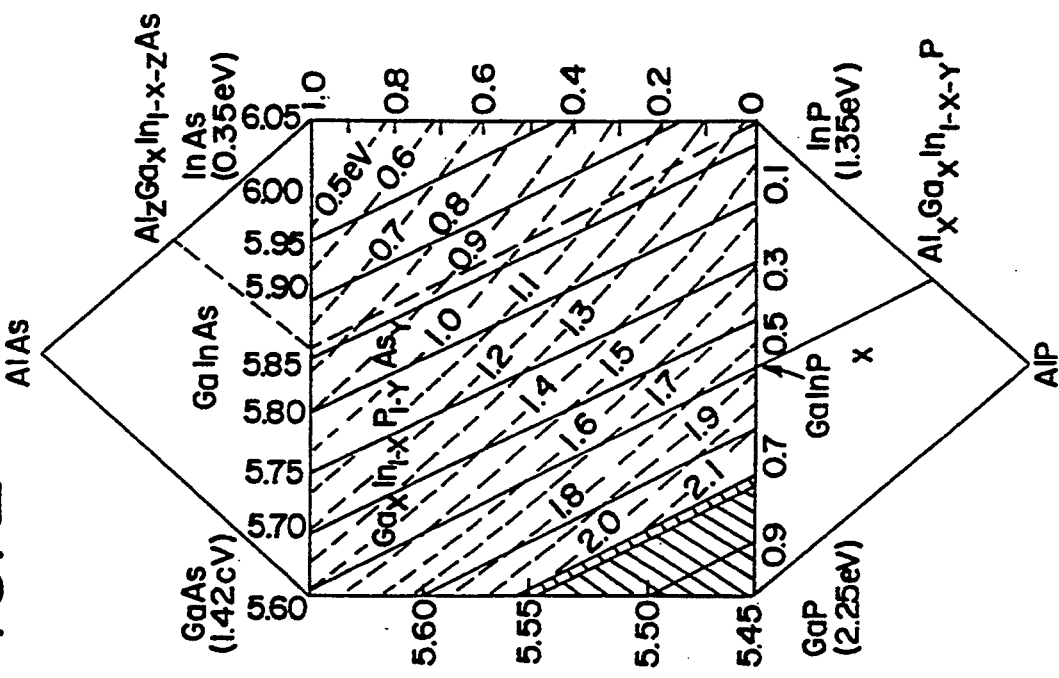
FIG. 3 is a cross-section through a GaAs substrate with an epitaxial laser structure for emission of radiation from 650→1100 nm.

Various other heterostructures were prepared using the procedure set forth above, resulting in a structure such as that set forth in FIG. 3. In these structures, the composition of the active layer was controlled by varying the partial pressures of the source ingredients. The waveguide and other layers were maintained at the compositions set forth in Example 1. Thus, different compositions of the active layer were prepared as set forth in Table 2 below.

TABLE 2

| Material (Active Layer) | Growth Temp. (°C.) | AsH3 cc/min of H2 | PH3 cc/min of H2 | TMIn cc/min of H2 | TEGa cc/min of H2 | λ (nm) | $E_g$ (eV) |
|---|---|---|---|---|---|---|---|
| $Ga_{.51}In_{.49}P$ | 530 | | 160 | 145 | 325 | 656 | 1.89 |
| $Ga_{.68}In_{.32}As_{.33}P_{.67}$ | 530 | 20 | 160 | 100 | 365 | 721 | 1.72 |
| $Ga_{.75}In_{.25}As_{.48}P_{.52}$ | 530 | 20 | 160 | 125 | 365 | 770 | 1.61 |
| $Ga_{.82}In_{.18}As_{.64}P_{.36}$ | 530 | 100 | 100 | 100 | 450 | 805 | 1.54 |

In a similar fashion, diode lasers were prepared having the same substrate, cladding, waveguide, and cap layers. In each, the active layer composition was varied, resulting in different lasing wavelengths. The results are set forth in Table 3 below.

TABLE 3

| Active Layer | $E_g$ (eV) | λ (nm) |
|---|---|---|
| $Ga_{0.51}In_{0.49}P$ | 1.874 | 662 |
| $Ga_{0.56}In_{0.44}As_{0.11}P_{0.89}$ | 1.812 | 684 |
| $Ga_{0.61}In_{0.39}As_{0.21}P_{0.79}$ | 1.754 | 707 |
| $Ga_{0.66}In_{0.34}As_{0.32}P_{0.68}$ | 1.700 | 729 |
| $Ga_{0.71}In_{0.29}As_{0.52}P_{0.58}$ | 1.650 | 752 |
| $Ga_{0.76}In_{0.24}As_{0.52}P_{0.48}$ | 1.602 | 774 |
| $Ga_{0.81}In_{0.19}As_{0.62}P_{0.38}$ | 1.559 | 796 |
| $Ga_{0.86}In_{0.14}As_{0.72}P_{0.28}$ | 1.518 | 817 |
| $Ga_{0.91}In_{0.09}As_{0.82}P_{0.18}$ | 1.48 | 838 |
| $Ga_{0.96}In_{0.04}As_{0.92}P_{0.08}$ | 1.446 | 858 |
| $Ga_xIn_{1-x}As$ (x = 1.0) | | 840 |
| $Ga_xIn_{1-x}As$ (x = 0.8) | 858 | 1100 |

The resulting diode lasers have exhibited different wavelengths in the absorption band as set forth in Table 2 and 3. From the above Tables, it is clear that the variation of the In/Ga/As/P ratios of the respective layers of the heterostructure results in a concomitant variation in the wavelength of light emitted by the diode laser, most notably from about 650 nanometers to about 1100 nanometers.

Thus, as the ratio of Ga:In varies from about 0.5:0.5 to about 1.0:0 and the ratio of As:P increases from about 0:1.0 to about 1.0:0, the wavelength increases to from about 650 nm to about 860 nm. Further, with $Ga_xIn_{1-x}As$, and changing x from 1.0 to 0.8, the wavelength can be changed from 840 nm to 1100 nm.

More specifically, the wavelength of the diode laser of the subject invention varies proportionately with the concentration of Ga (and inversely proportional with the In concentration) in the compositional structure. Thus, by the method of the subject invention, the wavelength of a diode laser can be adjusted as desired within the range of 650 nm to 1100 nm.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents falling within the scope of the appended claims.

Various features of the invention are set forth in the following claims.

I claim:

1. A method for controlling the wavelength of light in a diode laser through the preparation of a strained layer heterostructure for a diode laser by LP-MOCVD comprising the steps of:
   a) preparing a substrate;
   b) growing, in succession, the following layers on said substrate;
      1) a first cladding layer;
      2) doping said first cladding layer with a dopant consisting of Si;
      3) two waveguide layers of $Ga_xIn_{1-x}As_yP_{1-y}$ X=0.5 to 1 Y=0 to 0.92);
      4) an undoped active layer of $Ga_xIn_{1-x}As_yP_{1-y}$ between said waveguide layers, where a first ratio of As:P varies and a second ratio of In:Ga varies.
      5) a second doped cladding layer, and
   c) varying the composition of said active layer by varying said first and second ratios of said active layer so that the wavelength of light emitted by said diode laser is controlled from about 660 nm to about 1100 nm.

2. The method of claim 1 including the step of doping said second cladding layer with Zn.

3. The method of claim 1 wherein said active layer is varied in composition from about $Ga_{0.50}In_{0.50}As_yP_{1-y}$ to about $Ga_{0.96}In_{0.92}As_yP_{1-y}$.

4. A method for the preparation of a strained layer heterostructure for a diode laser by LP-MOCVD comprising the steps of:
   a) preparing a heated substrate consisting essentially of a Si-doped GaAs;
   b) growing, in succession, the following layers on said substrate by the flow of trimethyl indium, triethyl gallium, arsine, and phosphine to said heated substrate:
      1) a first cladding layer;
      2) two waveguide layers of $Ga_xIn_{1-x}As_yP_{1-y}$ (X=0.5 to 1, Y=0 to 0.92)
      3) an undoped active layer of a GaInAsP composition
      4) a second cladding layer, and
   c) doping said second cladding layers by cooling said substrate and grown layers,
   terminating the flow of said trimethyl indium, triethyl gallium, arsine, and phosphine;
   introducing to said second cladding layer a dopant selected from the group consisting of silane and diethyl zinc, and growing a cap layer of GaAs.

* * * * *

UNITED STATES PATENT AND TRADEMARK OFFICE
CERTIFICATE OF CORRECTION

PATENT NO. : 5,389,396
DATED : February 14, 1995
INVENTOR(S) : M. Razeghi

It is certified that error appears in the above-identified patent and that said Letters Patent is hereby corrected as shown below:

Column 1, line 1, after the title of the invention, please insert:

--This invention was made with Government support under Grant No. DAAH-04-93-G-0044 awarded by the Advanced Research Projects Agency. The Government has certain rights in the invention--.

Signed and Sealed this

Sixteenth Day of May, 1995

*Attest:*

BRUCE LEHMAN

*Attesting Officer*     *Commissioner of Patents and Trademarks*